United States Patent
Tu et al.

(10) Patent No.: US 12,550,777 B2
(45) Date of Patent: Feb. 10, 2026

(54) SEMICONDUCTOR DEVICE, SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Meng-Che Tu, Hsinchu (TW); Po-Han Wang, Hsinchu (TW); Yu-Hsiang Hu, Hsinchu (TW); Hung-Jui Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 362 days.

(21) Appl. No.: 18/448,957

(22) Filed: Aug. 13, 2023

(65) Prior Publication Data

US 2025/0054826 A1    Feb. 13, 2025

(51) Int. Cl.
*H01L 23/31*    (2006.01)
*H01L 21/56*    (2006.01)
(Continued)

(52) U.S. Cl.
CPC ........ *H01L 23/3128* (2013.01); *H01L 21/568* (2013.01); *H01L 23/49822* (2013.01); *H01L 24/13* (2013.01); *H01L 24/32* (2013.01); *H01L 25/0655* (2013.01); *H01L 2224/13007* (2013.01); *H01L 2224/32146* (2013.01); *H01L 2224/32235* (2013.01); *H01L 2924/15311* (2013.01); *H01L 2924/182* (2013.01)

(58) Field of Classification Search
CPC .......................... H01L 23/3114; H01L 23/293
See application file for complete search history.

(56) References Cited

U.S. PATENT DOCUMENTS 8,048,778 B1 * 11/2011 Ku .......................... H01L 21/78
257/E21.599
8,580,657 B2 * 11/2013 Kuo ........................ H01L 24/05
257/797

(Continued)

FOREIGN PATENT DOCUMENTS

TW    202038343    10/2020
TW    202218103    5/2022

OTHER PUBLICATIONS

"Office Action of Taiwan Counterpart Application", issued on Aug. 5, 2024, p. 1-p. 8.

*Primary Examiner* — Errol V Fernandes
(74) *Attorney, Agent, or Firm* — JCIPRNET

(57) ABSTRACT

A semiconductor device includes a semiconductor substrate, a plurality of semiconductor dies, a dielectric layer, a connector, and a passivation layer. The plurality of semiconductor dies are stacked on one another and disposed over the semiconductor substrate. The dielectric layer cover a top surface and a side surface of the each of the plurality of semiconductor dies. The connector is disposed over a topmost one of the plurality of semiconductor dies. The passivation layer is disposed over the dielectric layer and laterally surrounds the connector, wherein, from a cross sectional view, an acute angle is included between an outermost side surface of the passivation layer and a bottom surface of the passivation layer.

20 Claims, 20 Drawing Sheets

(51) Int. Cl.
    *H01L 23/00*     (2006.01)
    *H01L 23/498*     (2006.01)
    *H01L 25/065*     (2023.01)

(56) References Cited

U.S. PATENT DOCUMENTS

| | | | |
|---|---|---|---|
| 9,196,532 B2 * | 11/2015 | Tu | H01L 24/05 |
| 9,559,005 B2 * | 1/2017 | Tsai | H01L 21/561 |
| 9,653,417 B2 * | 5/2017 | Wang | H01L 23/3114 |
| 9,922,895 B2 * | 3/2018 | Chiu | H01L 24/05 |
| 12,165,966 B2 * | 12/2024 | Tu | H01L 21/561 |
| 2013/0341800 A1 * | 12/2013 | Tu | H01L 23/585 |
| | | | 257/774 |
| 2015/0125997 A1 * | 5/2015 | Wang | H01L 21/3086 |
| | | | 438/114 |
| 2016/0035663 A1 * | 2/2016 | Huang | H01L 23/49833 |
| | | | 257/668 |
| 2017/0005049 A1 * | 1/2017 | Huang | H01L 23/49838 |
| 2019/0019765 A1 * | 1/2019 | Chen | H01L 21/56 |
| 2023/0013491 A1 * | 1/2023 | Tu | H01L 21/76802 |

\* cited by examiner

SEMICONDUCTOR DEVICE, SEMICONDUCTOR PACKAGE AND MANUFACTURING METHOD THEREOF

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
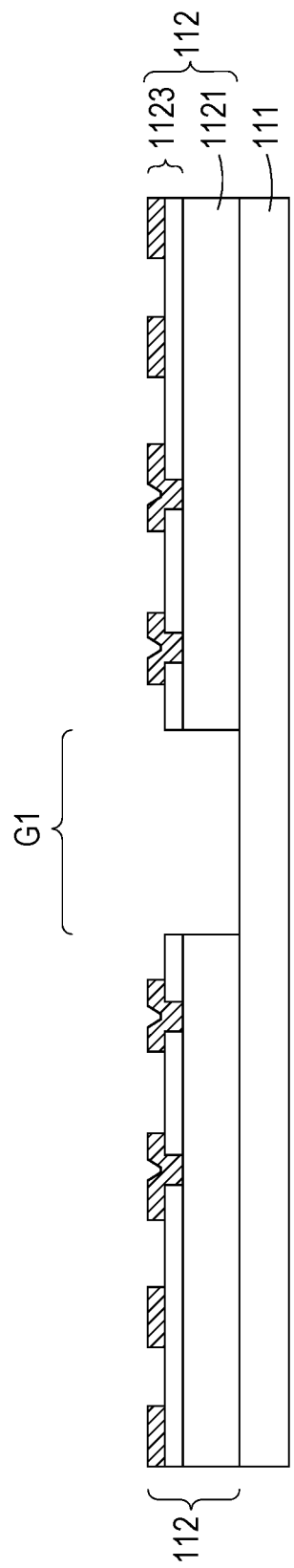
FIG. 1 to FIG. 8 illustrate cross sectional views of intermediate stages in the manufacturing of a semiconductor device according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 8 illustrate cross sectional views of intermediate stages in the manufacturing of a semiconductor device according to some exemplary embodiments of the present disclosure. Referring to FIG. 1, a semiconductor substrate 111 is provided. The semiconductor substrate 111 may be in a wafer form. For example, the wafer-form semiconductor substrate 111 may be processed to include multiple die regions. In some embodiments, the semiconductor substrate 111 is attached to a temporary carrier or a frame including an adhesive layer.

In some embodiments, the semiconductor substrate 111 may be seen as a carrier wafer for bonding a plurality of dies thereon. In other embodiments, the semiconductor substrate 111 may be the semiconductor substrate 111 may include semiconductor devices formed therein, and interconnect structure formed over the semiconductor substrate. It should be noted that various layers and features of the semiconductor substrate 111 are omitted from the figures. For example, the semiconductor substrate 111 includes a bulk semiconductor, a semiconductor-on-insulator (SOI) substrate, other supporting substrate (e.g., quartz, glass, etc.), combinations thereof, or the like, which may be doped or undoped.

In some embodiments, the semiconductor substrate 111 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminium gallium arsenide (AlGaAs), gallium indium arsenide (GaInAs), gallium indium phosphide (GaInP), etc.), combinations thereof, or other suitable materials. For example, the compound semiconductor substrate may have a multilayer structure, or the substrate may include a multilayer compound semiconductor structure.

In some embodiments, a plurality of first semiconductor dies 112 are provided over the semiconductor substrate 111. The first semiconductor dies 112 may be firstly formed in a semiconductor wafer. For example, the semiconductor wafer is processed to include multiple die regions, and each of the die regions may include integrated circuit devices (e.g., a logic die, a memory die, a radio frequency die, a power management die, a micro-electro-mechanical-system (MEMS) die, the like, or combinations of these). In some embodiments, the semiconductor wafer is attached to a temporary carrier or a frame including an adhesive tape, and then the semiconductor wafer is singulated along scribe lines to form individual semiconductor dies 112. Then, the separated semiconductor dies 112 may be picked and placed on the semiconductor substrate 111 where the first semiconductor dies 112 are separated from one another by a plurality of gaps G1.

In some embodiments, the first semiconductor dies 112 and the semiconductor substrate 111 may be separately fabricated, and the first semiconductor dies 112 may then be removed from the tape frame to be mounted on the semiconductor substrate 111 by using, for example, a pick-andplace process or other suitable attaching techniques. The first semiconductor dies 112 may be tested before bonding, so that only known good die (KGD) is used for attaching.

In some embodiments, the first semiconductor dies 112 may include a semiconductor substrate 1121 having semiconductor devices (not shown) formed therein and an interconnect structure 1123 formed on the semiconductor substrate 1121. In some embodiments, the semiconductor substrate 1121 of the first semiconductor dies 112 includes a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 1121 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminium gallium arsenide (AlGaAs), gallium indium arsenide (GaInAs), gallium indium phosphide (GaInP), etc.), combinations thereof, or other suitable materials. For example, the compound semiconductor substrate may have a multilayer structure, or the substrate may include a multilayer compound semiconductor structure. In some embodiments, the alloy SiGe is formed over a silicon substrate. In other embodiments, a SiGe substrate is strained. The semiconductor substrate 1121 may include the semiconductor devices (not shown) formed therein or thereon, and the semiconductor devices may be or may include active devices (e.g., transistors, diodes, etc.) and/or passive devices (e.g., capacitors, resistors, inductors, etc.), or other suitable electrical components. In some embodiments, the semiconductor devices are formed at the side of the semiconductor substrate 1121 proximal to the interconnect structure 1123.

In some embodiments, the semiconductor substrate 1121 may include circuitry (not shown) formed in a front-end-of-line (FEOL), and the interconnect structure 1123 may be formed in a back-end-of-line (BEOL). In some embodiments, the interconnect structure 1123 includes an interlayer dielectric (ILD) layer formed over the semiconductor substrate 1121 and covering the semiconductor devices, and an inter-metallization dielectric (IMD) layer formed over the ILD layer. In some embodiments, the ILD layer and the IMD layer are formed of a low-K dielectric material or an extreme low-K (ELK) material, such as an oxide, silicon dioxide, borophosphosilicate glass (BPSG), phosphosilicate glass (PSG), fluorinated silicate glass (FSG), SiOxCy, Spin-On-Glass, Spin-On-Polymers, silicon carbon material, compounds thereof, composites thereof, combinations thereof, or the like. The ILD layer and the IMD layer may include any suitable number of dielectric material layers which is not limited thereto.

For example, the interconnect structure 1123 including one or more dielectric layer(s) and metallization pattern(s) is formed on the semiconductor substrate 1121. The metallization pattern(s) may be embedded in the dielectric layers (e.g., the IMD layers), and the metallization patterns (e.g., metal lines, metal vias, metal pads, etc.) may be formed of conductive materials such as copper, gold, aluminum, the like, or combinations thereof. In some embodiments, the interconnect structure 1123 is electrically coupled to the semiconductor devices formed in and/or on the semiconductor substrate 1121 to one another and to external components (e.g., test pads, bonding conductors, etc.). For example, the metallization patterns in the dielectric layers route electrical signals between the semiconductor devices of the semiconductor substrate 1121. The semiconductor devices and metallization patterns are interconnected to perform one or more functions including memory structures (e.g., memory cell), processing structures, input/output circuitry, or the like.

Figure 2:
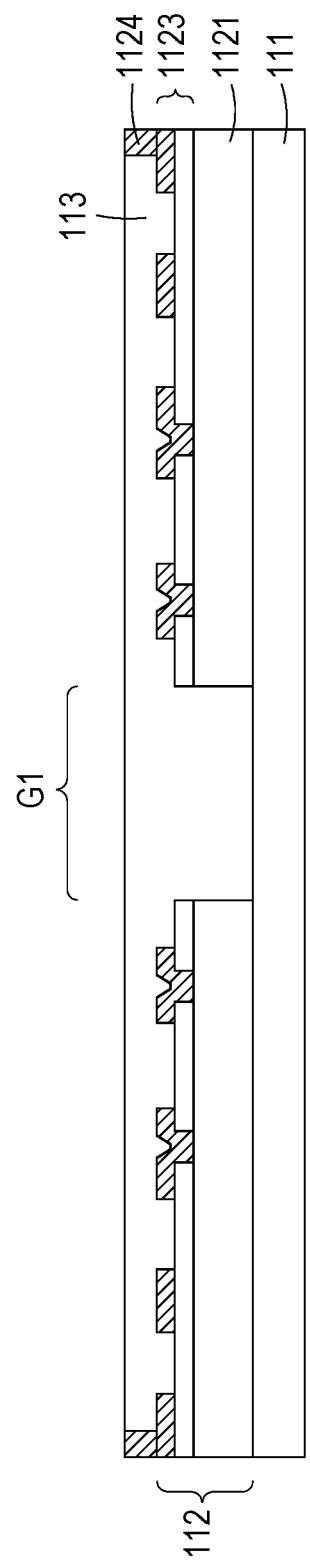

Then, referring to FIG. 2, a first dielectric layer 113 is provided over the semiconductor substrate 111. In some embodiments, the first dielectric layer 113 fills the gaps G1 between the adjacent first semiconductor dies 112 and covers the top surfaces and side surfaces of the first semiconductor dies 112. For example, the first dielectric layer 113 may be a dielectric layer made of one or more suitable dielectric materials such as silicon oxide, silicon nitride, low-k dielectrics, polyimide, combinations of these, or the like. In one embodiment, a material of the dielectric layer 113 includes oxide, such as silicon oxide, etc. In some embodiments, the first semiconductor dies 112 may include a conductive pad (not shown) disposed over and electrically coupled to the top metallization pattern of the interconnect structure 1123, and the first dielectric layer 113 may have an opening exposing at least a portion of the conductive pad for testing or for further electrical connection. After first dielectric layer 113 is provided, a planarization process such as a chemical mechanical polishing (CMP) operation may be performed to flatten the top surface of the first dielectric layer 113.

In some embodiments, a plurality of connectors 1124 may be formed in the dielectric layer 113 to be connected to the interconnect structures 1123 of the first semiconductor dies 112 respectively. The connectors 1124 may be conductive pillars or vias (for example, comprising a metal such as copper, aluminum, tungsten, nickel, or alloys thereof), and are mechanically and electrically connected to the interconnect structure 1123. The connectors 1124 may be formed by, for example, plating, or the like. The connectors 1124 electrically connect the respective integrated circuits of the first semiconductor dies 112. It is noted that one connector 1124 connected to one first semiconductor die 112 is illustrated, but more than one connectors 1124 may be disposed over on one first semiconductor die 112.

Figure 3:
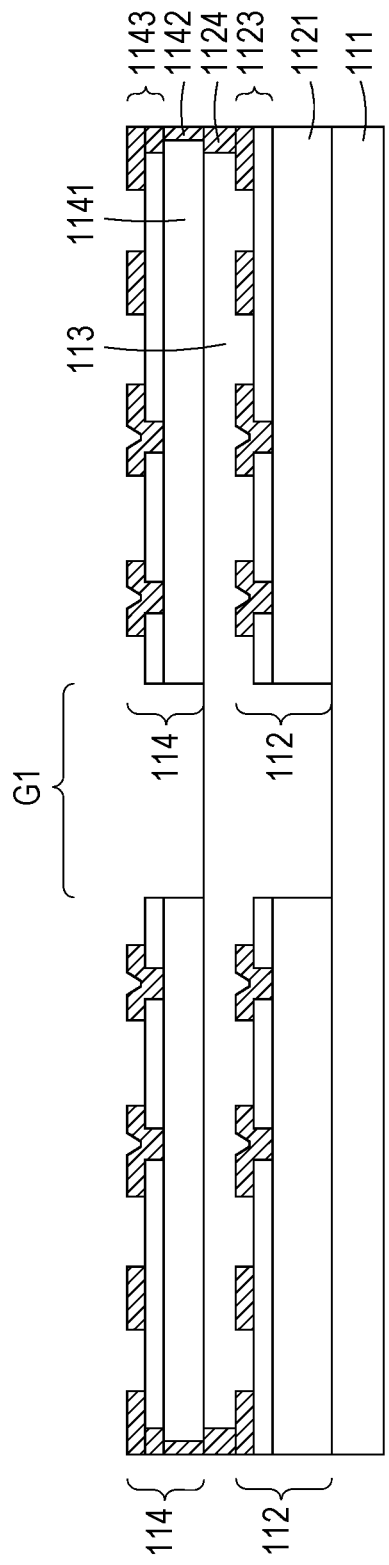

Then, referring to FIG. 3, a plurality of second semiconductor dies 114 are provided over the first semiconductor dies 112 respectively to form a second tier of the die stack. A similar process for forming the first semiconductor dies 112 may be applied to form the second semiconductor dies 114. The second semiconductor dies 114 may be firstly in a wafer form as a semiconductor wafer, which includes multiple die regions, and each die region may include integrated circuit devices (e.g., a logic die, a memory die, a radio frequency die, a power management die, a micro-electromechanical-system (MEMS) die, the like, or combinations of these). The configuration of die regions may be similar to that of first semiconductor dies 112 described above. For example, each die location may include the semiconductor substrate 1141, and the interconnect structure 1143.

In some embodiments, each of the second semiconductor dies 114 may further include a plurality of conductive vias 1142 formed in the semiconductor substrate 1141 and connected to the interconnect structure 1143. In an embodiment, the conductive vias 1142 are formed by forming recesses in the semiconductor substrate 1141 and depositing dielectric liner, barrier materials, and conductive materials in the recesses, removing excess materials on the semiconductor substrate 1141. For example, the recesses of the semiconductor substrate 1141 are lined with the dielectric liner so as to laterally separate the conductive vias 1142 from the semiconductor substrate 1141. The conductive vias 1142 may be formed by using a via-first approach. For example, the conductive vias 1142 are formed during the formation of the interconnect structure 1143. Alternatively, the conductive vias 1142 (i.e. TSVs) are formed by using a via-last approach, and may be formed after the formation of interconnect structure 1143.

In some embodiments, the first semiconductor dies 112 and the second semiconductor dies 114 may be separately fabricated, and the second semiconductor dies 114 may then be removed from the tape frame to be mounted over the first semiconductor dies 112 by using, for example, a pick-and-place process or other suitable attaching techniques. The second semiconductor dies 114 may be tested before bonding, so that only known good die (KGD) is used for attaching. It is appreciated that semiconductor dies diced from different semiconductor wafers may have different properties and functions. In some embodiments, the first semiconductor dies 112 and the second semiconductor dies 114 are singulated from different semiconductor wafers, and may be different in functions and properties. For example, the first semiconductor dies 112 and the second semiconductor dies 114 may be bonded together in a face-to-back configuration. In some embodiments, the second semiconductor dies 114 are picked and placed over the first semiconductor dies 112 respectively. The front side of the first semiconductor dies 112 may be bonded to the back surface of the second semiconductor dies 114. The first semiconductor dies 112 and the second semiconductor dies 114 may be similar in configurations, functions, and properties.

Figure 3A:
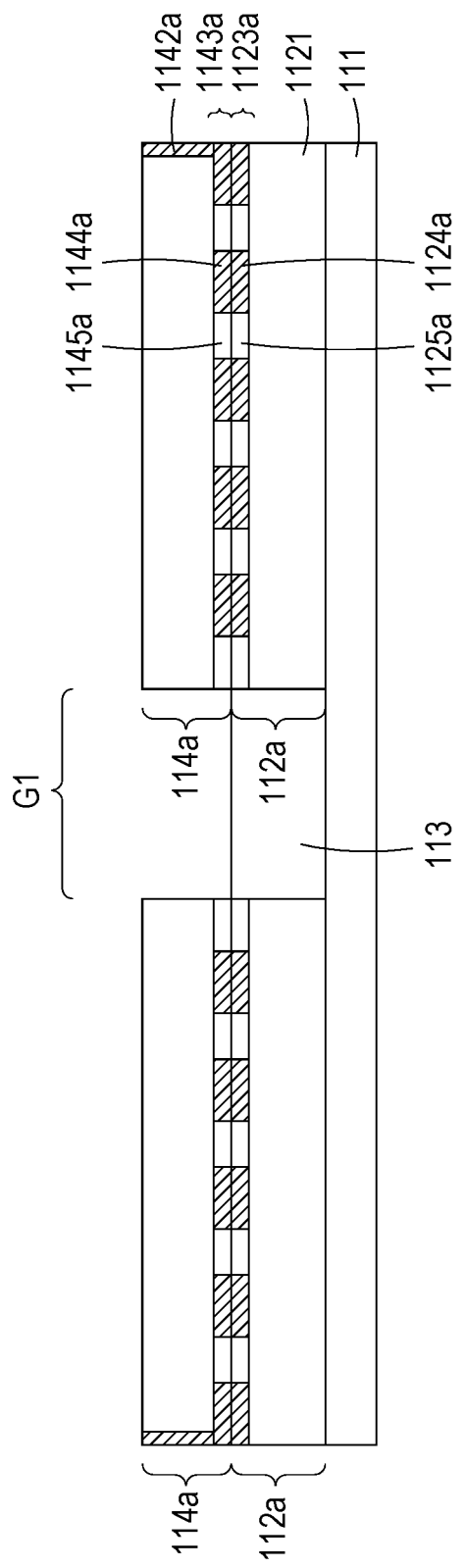
Figure 3B:
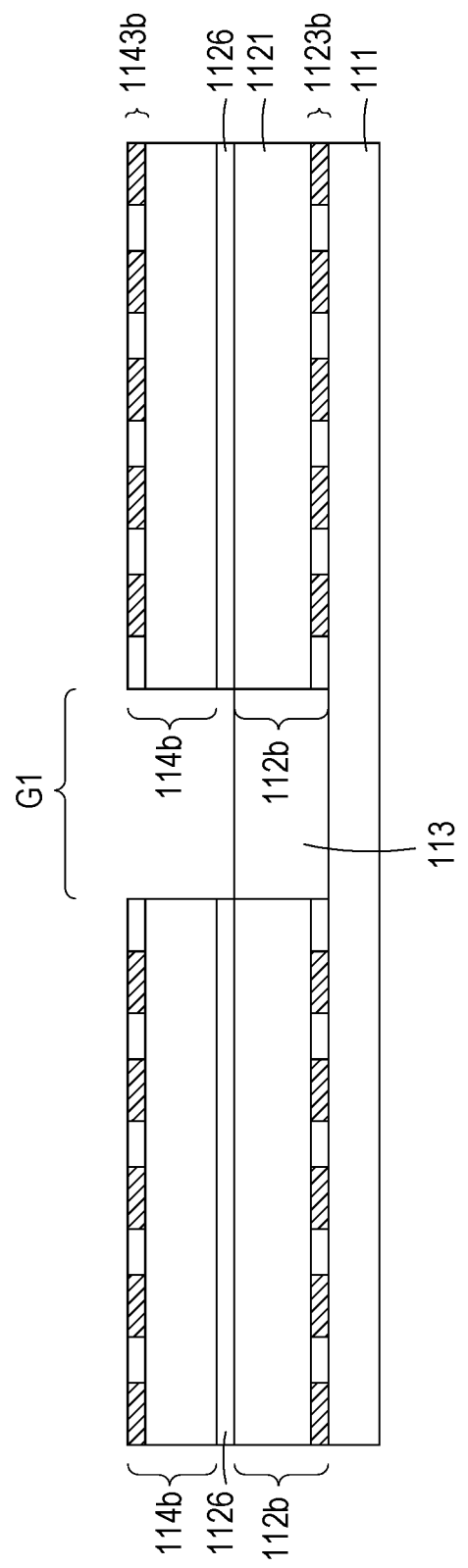

In the embodiment of FIG. 3, the first semiconductor dies 112 and the second semiconductor dies 114 are stacked in a face-to back manner. However, the disclosure is not limited thereto, and other die stack manners may also be applied. For example, FIG. 3A and FIG. 3B illustrates cross sectional views of the intermediate stage in the manufacturing of the semiconductor device according to different embodiments other than FIG. 3. Referring to FIG. 3A, in this embodiments, the first semiconductor dies 112a and the second semiconductor dies 114a are stacked in a face-to face manner. That is, the front side of the first semiconductor dies 112a and the front side of the second semiconductor dies 114a face each other. In one embodiment, before the second semiconductor dies 114a mounted onto the first semiconductor dies 112a, a planarization process may be applied to the dielectric layer 113 till the first connectors 1124a of the interconnect structure 1123a are revealed. Then, the second semiconductor dies 114a are further turned upside down and mounted onto the first semiconductor dies 112a.

In detail, the first semiconductor dies 112a and the second semiconductor dies 114a are face-to-face bonded together via the first connectors 1124a and the second connectors 1144a. In some embodiments, before the second semiconductor dies 114a is bonded to the first semiconductor dies 112a, the interconnect structure 1123a and the interconnect structure 1143a are aligned, such that the first connectors 1124a of the interconnect structure 1123a may be bonded to the second connectors 1144a of the interconnect structure 1143a, and the first dielectric layer 1125a of the interconnect structure 1123a may be bonded to the second dielectric layer 1145a of the interconnect structure 1143a. In some embodiments, the alignment of the first connectors 1124a and the second connectors 1144a may be achieved by using an optical sensing method. After the alignment is achieved, the interconnect structure 1123a and the interconnect structure 1143a are bonded together by hybrid bonding process.

In one embodiment, the interconnect structure 1123a and the interconnect structure 1143a are hybrid bonded together by the application of pressure and heat. It is noted that the hybrid bonding involves at least two types of bonding, including metal-to-metal bonding and non-metal-to-non-metal bonding such as dielectric-to-dielectric bonding or fusion bonding. To be more specific, the first connectors 1124a and the second connectors 1144a bonded by metal-to-metal bonding, and the dielectric layer 1125a and the second dielectric layer 1145a bonded by non-metal-to-non-metal bonding.

In some embodiments, a plurality of through vias 1142a may be formed in the second semiconductor dies 114a. The through vias 1142a penetrate the semiconductor substrate 1141a and is electrically connected with the second connectors 1144a of the first interconnect structure 1143a. In some embodiments, the through vias 1142a includes conductive vias, which may be made of copper, copper alloys, aluminum, aluminum alloys, or combinations thereof. In some other embodiments, the through vias 1142a may further include a diffusion barrier layer (not shown) surround the conductive vias. The diffusion barrier layer is made of Ta, TaN, Ti, TiN, CoW or a combination thereof, and may be formed by a suitable process such as electro-chemical plating process, CVD, atomic layer deposition (ALD), PVD or the like. The through vias 1142a are used to provide electrical connections on the backside of the second semiconductor dies 114a.

Referring to FIG. 3B, in this embodiments, the first semiconductor dies 112b and the second semiconductor dies 114b are stacked in a back-to back manner. That is, the front side of the first semiconductor dies 112b and the front side of the second semiconductor dies 114b face in opposing directions. To be more specific, the front side of the first semiconductor dies 112b faces downward in the illustrated orientation, while the front side of the second semiconductor dies 114b faces upward.

In this embodiment, the first semiconductor dies 112b is placed on the semiconductor substrate 111 with the front side facing the semiconductor substrate 111. The front side of the first semiconductor dies 112b includes the interconnect structure 1123b, which may be electrically connected to the semiconductor substrate 111. The dielectric layer 113 is disposed over the semiconductor substrate 111, and laterally encapsulates the first semiconductor dies 112a. Then, the second semiconductor dies 114b is positioned in a back-to-back relationship with the first semiconductor dies 112b. While the possibility that the second semiconductor dies 114b may be placed in intimate contact with the first semiconductor dies 112b is by no means precluded, it is generally preferred that at least one layer of die attach material 1126 is disposed between the second semiconductor dies 114b and underlying first semiconductor dies 112b. In one embodiment, the die attach material 1126 may be dispensed onto the backsides of the first semiconductor dies 112b prior to placement of the second semiconductor dies 114b thereon. The die attach material 1126 may be an electrically-conductive adhesive, an electrically-insulative adhesive, or an electrically-anisotropic adhesive film.

In an embodiment of the die attach material 1126 disposed between and bonding the neighboring backsides of semiconductor dies 112b and 114b together, the die attach material 1126 may be an electrically-insulative or electrically-conductive adhesive. For example, in embodiments wherein the respective backsides of semiconductor dies 112b and 114b lack electrically-conductive features, an electrically-conductive adhesive (e.g., a silver- or copperfilled epoxy) may be utilized as die attach material 1126. Such an electrically-conductive adhesive may also have a relatively high thermal conductivity to allow conductive heat transfer across the die-to-die interface, which may improve heat dissipation between semiconductor dies 112b and 114b. In other embodiments, it may be desirable to provide electrical interconnection between aligning electrically-conductive features located on the respective backsides of the semiconductor dies 112b and 114b. In this case, an anisotropic paste or film can be utilized as die attach material 1126. Such an anisotropic paste or film allows electrical conduction through the thickness of the die attach material 1126, while providing electrical insulation along the plane of the die attach material 1126.

For the purpose of illustration, the die stack structure shown in FIG. 3, i.e., the semiconductor dies 112 and 114 positioned in a face to back manner, are applied to the rest of the figures. However, it is noted that the die stack structures shown in FIG. 3, FIG. 3A, FIG. 3B, and other suitable die stack structures are also applicable to the semiconductor package and manufacturing process disclosed herein.

Figure 4:
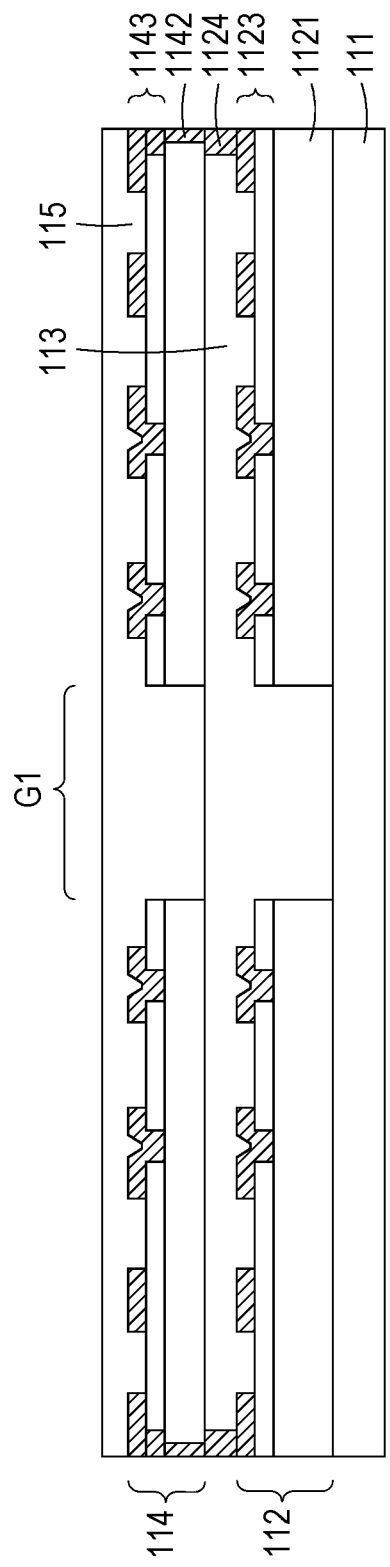
Figure 5:
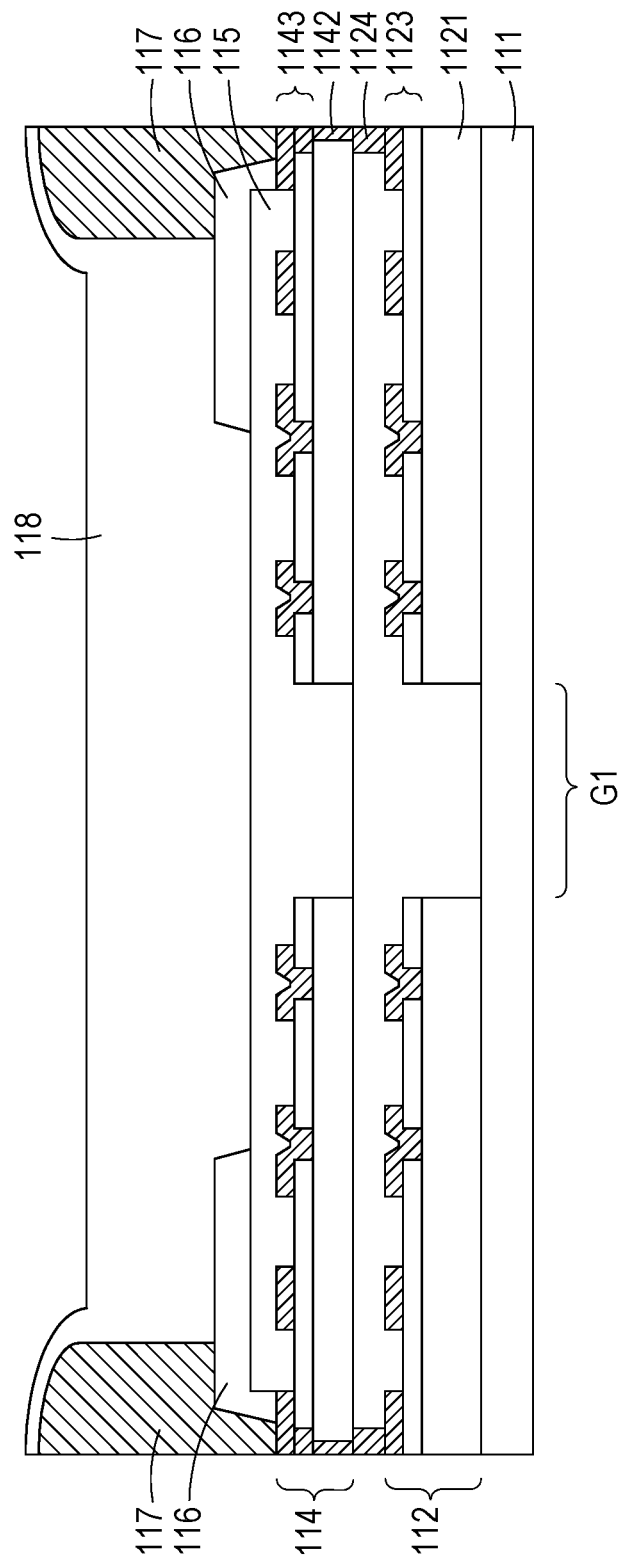

Referring to FIG. 4, a second dielectric layer 115 is provided over the first semiconductor dies 112. In detail, the second dielectric layer 115 covers the first dielectric layer 113, fills the gaps between the adjacent second semiconductor dies 114, and covers the top surfaces and side surfaces of the second semiconductor dies 114. For example, the second dielectric layer 115 may be a dielectric layer made of one or more suitable dielectric materials such as silicon oxide, silicon nitride, low-k dielectrics, polyimide, combinations of these, or the like. In one embodiment, a material of the second dielectric layer 115 includes oxide, such as silicon oxide, etc. In some embodiments, the second semiconductor dies 114 may include a conductive pad (not shown) disposed over and electrically coupled to the top metallization pattern of the interconnect structure 1143, and the second dielectric layer 115 may have an opening exposing at least a portion of the conductive pad for testing or for further electrical connection. After the second dielectric layer 115 is provided, a planarization process such as a chemical mechanical polishing (CMP) operation may be performed to flatten the top surface of the second dielectric layer 115.

In some embodiments, the steps described above may be repeated to form the die stack. It should be appreciated that the die stack disposed over the semiconductor substrate 111 may include any number of tiers. That is, the die stack includes a plurality of semiconductor dies (e.g., first semiconductor die 112, second semiconductor die 114, etc.) stacked on one another and is disposed over the semiconductor substrate 111. In the present embodiment, two tiers of die stack (including the first semiconductor die 112 and the second semiconductor die 114) are illustrated herein, but the disclosure is not limited thereto. In other embodiments, the die stack with less or more tiers may be provided over the semiconductor substrate 111.

In some embodiments, the semiconductor dies (e.g., semiconductor dies 112, 114) at each tier may be tested before bonding, so that only known good dies (KGDs) are used to form the device stack, thereby increasing manufacturing yield. In some embodiments in which the semiconductor dies (e.g., semiconductor dies 112, 114) are memory dies, since the semiconductor dies stacked and bonded vertically, faster inter-memory communication may be achieved by the die stack during operation, which in turn may improve data bandwidth and enable faster data access and data storage.

After the die stack with desired number of tiers is formed over the semiconductor substrate 111, an under-bump-metallurgy (UBM) layer 116 is formed over the topmost semiconductor die 114, such as on portions of the metal pad region of the interconnect structure 1143. The UBM layer 116 is selectively formed on the exposed portion of the metal pad region through an electroless deposition or an immersion technique. In one embodiment, the UBM layer 116 includes a diffusion barrier layer, which is formed of titanium (Ti), titanium nitride (TiN), tantalum nitride (TaN), tantalum (Ta), or the like. In one embodiment, the UBM layer 116 includes a copper layer with a thickness about 3000 Angstrom to 5000 Angstrom, although the thickness may be greater or smaller. Since a planarization process such as a CMP process is performed to flatten the top surface of the second dielectric layer 115, the UBM layer 116 is formed on a relatively flat surface (i.e., the top surface of the second dielectric layer 115) and thus enhances the bonding strength of the UBM layer 116.

Then, connectors 117 are provided over the topmost one of the semiconductor dies (e.g., the second semiconductor die 114). In detail, the connectors 117, such as conductive vias or pillars (formed of a metal such as copper, for example) and are physically and electrically coupled to respective UBM layer 116 and respective metal pad region of the interconnect structure 1143. The connectors 117 may be formed by, for example, plating, or the like, but the disclosure is not limited thereto. It is noted that one connector 117 is illustrated, but more than one connectors 117 may be disposed over on one topmost semiconductor die.

Then, a passivation layer 118 may be provided over the dielectric layer 115 of the topmost semiconductor dies 114 among the die stack. In some embodiments, the passivation layer 118 covers the dielectric layer 115, the passivation films 116, and at least laterally surrounds each of the connectors 117. Since a planarization process such as a CMP process is performed to flatten the top surface of the second dielectric layer 115, the passivation layer 118 is formed on a relatively flat surface and thus enhance the bonding strength of the passivation layer 118. Initially, the passivation layer 118 may bury the die connectors 117, such that a topmost surface of the passivation layer 118 is above topmost surfaces of the connectors 117. In some embodiments where solder regions are disposed on the connectors 117, the passivation layer 118 may bury the solder regions as well. In one embodiment, the passivation layer 118 is formed of a polymer layer, such as polyimide (PI), benzocyclobutene (BCB), polybenzoxazole (PBO), combinations thereof or the like, but the disclosure is not limited thereto. Furthermore, other relatively soft, often organic, dielectric materials can also be used. The passivation layer 118 may be formed by, for example, spin coating, lamination, chemical vapor deposition (CVD), or the like. In some embodiments, the connectors 117 are exposed through the passivation layer 118 during formation of the semiconductor device 110 by, for example, a thinning (e.g., CMP) process. In some embodiments, the die connectors 117 remain buried and are exposed during a subsequent process for packaging the semiconductor device 110.

Figure 6:
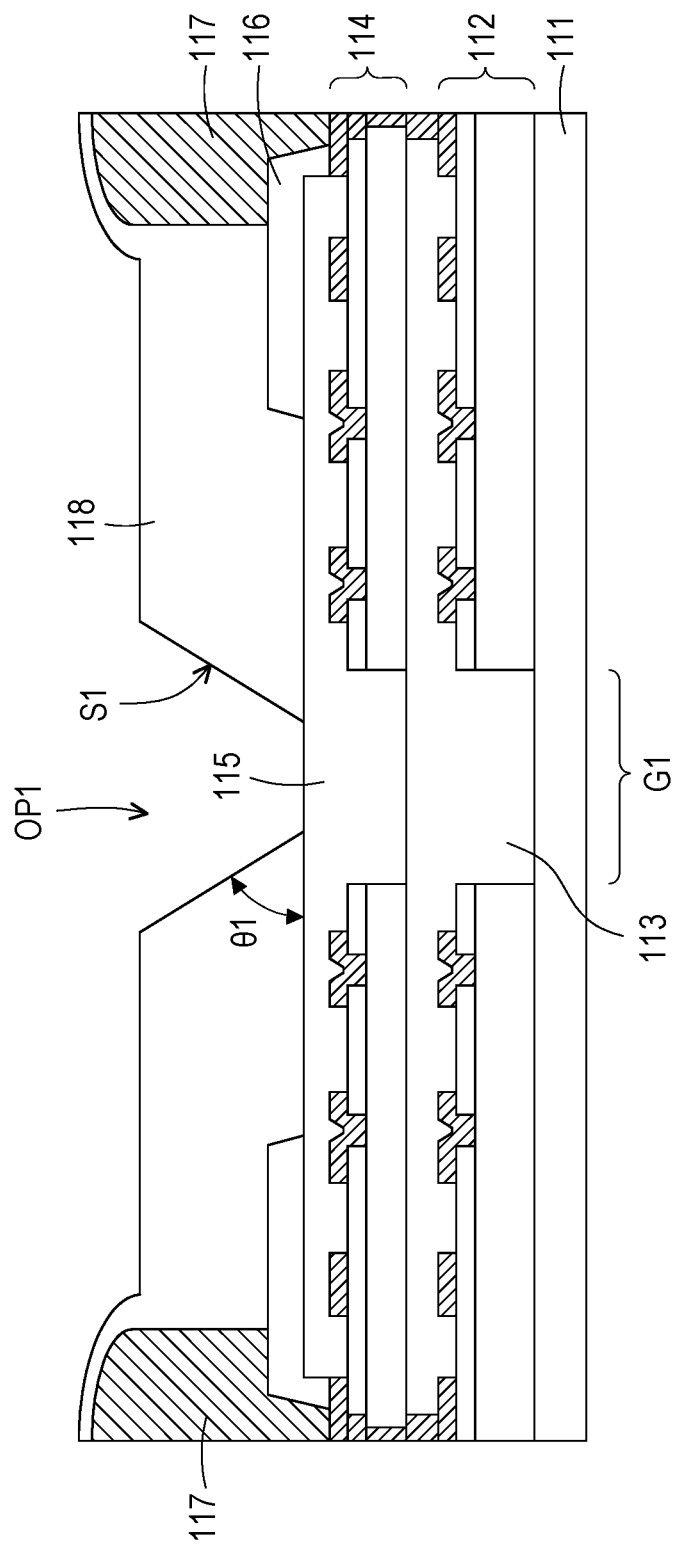
Figure 7:
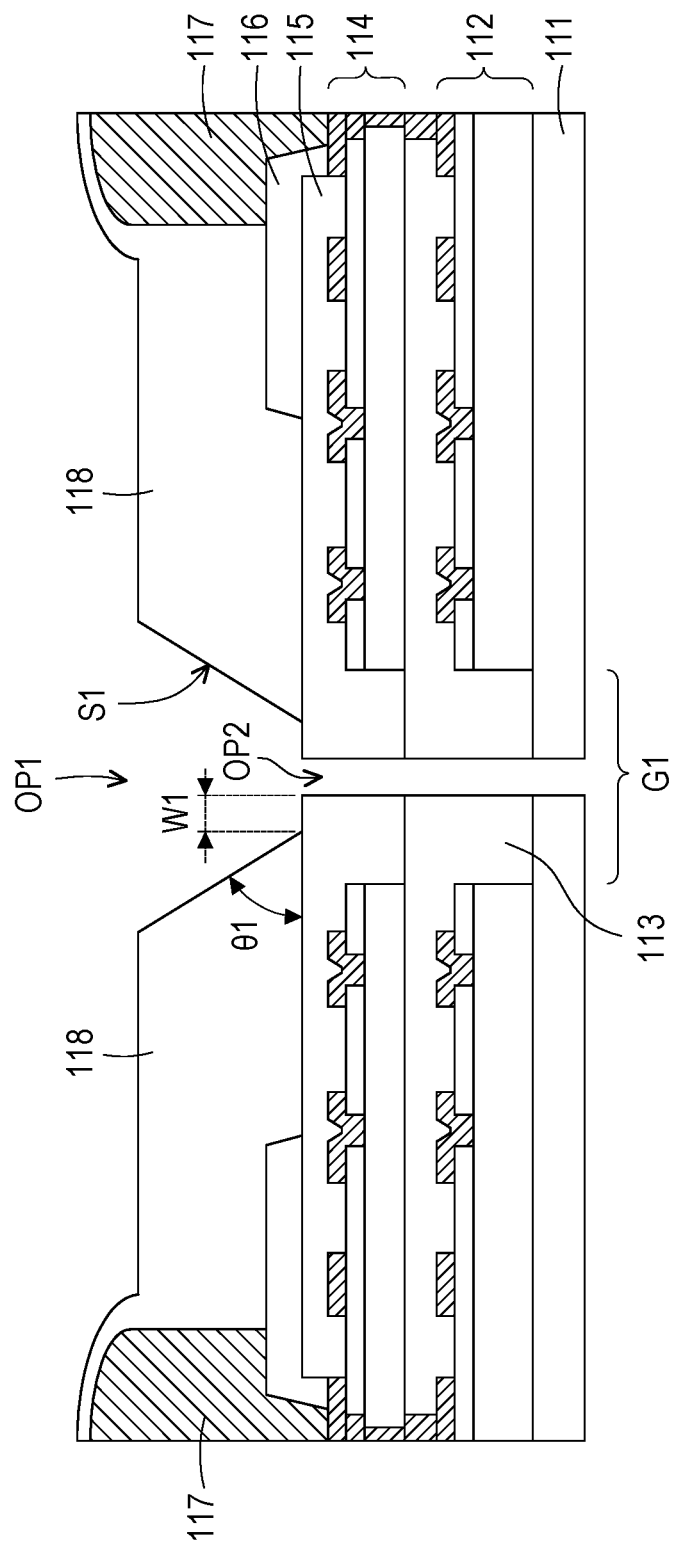

Then, referring to FIG. 6, in some embodiments, a singulation process is performed on the scribe line regions (within the gaps G1) to separate the individual semiconductor devices 110 as depicted in FIG. 7. Generally, for the singulation process, laser ablation is used to dice at least a top portion (e.g., interconnect structure, passivation layer, etc.) of a die to avoid cracks, debris, peeling and delamination of material layers of the die caused by a blade saw process. However, during the laser ablation, besides heating the material to melt or evaporate it, other effects such as plasma formation take place. Sometimes complex processes can take place at an interface. Using a laser with picoseconds pulse length, the oxide (material of dielectric layers 113, 115) to silicon (material of semiconductor substrate 111) interface is affected. Using a picoseconds laser with a UV wavelength, the interface effects are enhanced so that separation and delamination of the oxide film takes place from the silicon surface.

Figure 13:
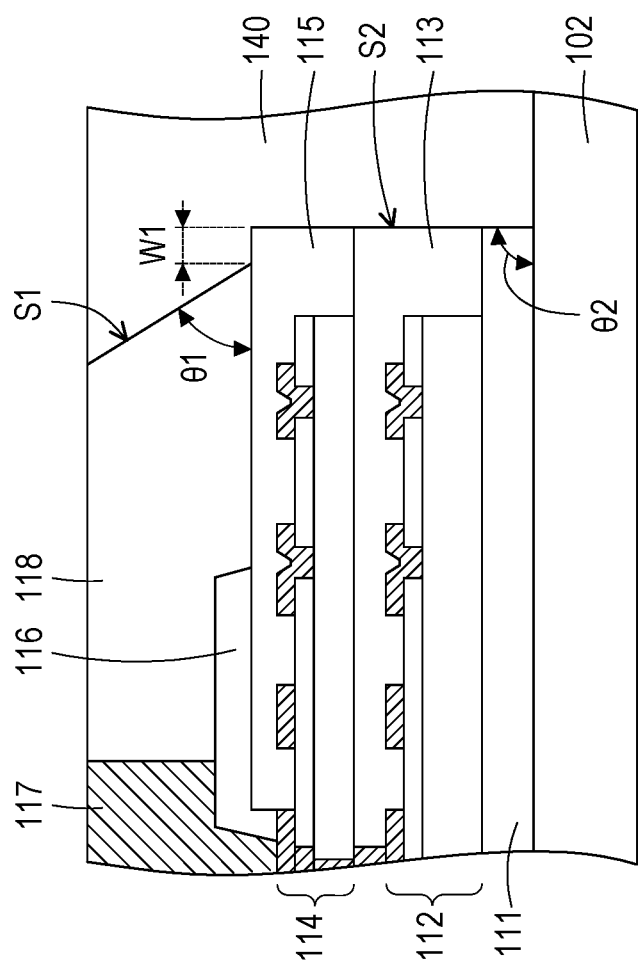

Accordingly, in the present embodiment, instead of blade saw process and laser ablation process, a patterning process is performed on the passivation layer 118 to form a plurality of openings OP1 corresponding to the gaps G1 respectively, so as to avoid cracks, debris, peeling and delamination of material layers of the die caused by the sawing process. It is noted that one opening OP1 is illustrated herein, but multiple openings OP1 may be applied depending on the amount of the gaps G1, which depends on the amount of the die stacks on the semiconductor substrate 111. In some embodiments, the patterning process for forming the openings OP1 includes photolithography and etching processes, and the openings OP1 penetrate through the passivation layer 118. Accordingly, the photolithography process produces sidewalls of openings OP1 with a relatively flat slope. In other words, the sidewall of each of the openings OP1 is a sloped surface tilted from a vertical direction as shown in FIG. 6. In some embodiments, from a cross sectional view as shown in FIG. 6, an acute angle θ1 is included between an outermost side surface S1 (i.e. sidewall of the openings OP1) of the passivation layer 118 and a bottom surface of the passivation layer 118. That is, the outermost side surface S1 of the passivation layer 118 forms an acute angle θ1 with a plane parallel to the top surface of the dielectric layer 115. In one embodiment, the acute angle θ1 is smaller than about 90° and substantially equal to or greater than about 70° (i.e.,) 70°≤θ1<90°. If the acute angle θ1 is smaller than 70°, the mount of encapsulating material 140 (as shown in FIG. 13) subsequently applied to fill the openings OP1 may be too much, which may lead to serious warpage of the package. Therefore, the width of the openings OP1 decreases as the openings OP1 extends from the top surface of the passivation layer 118 toward the dielectric layer 115.

Figure 8:
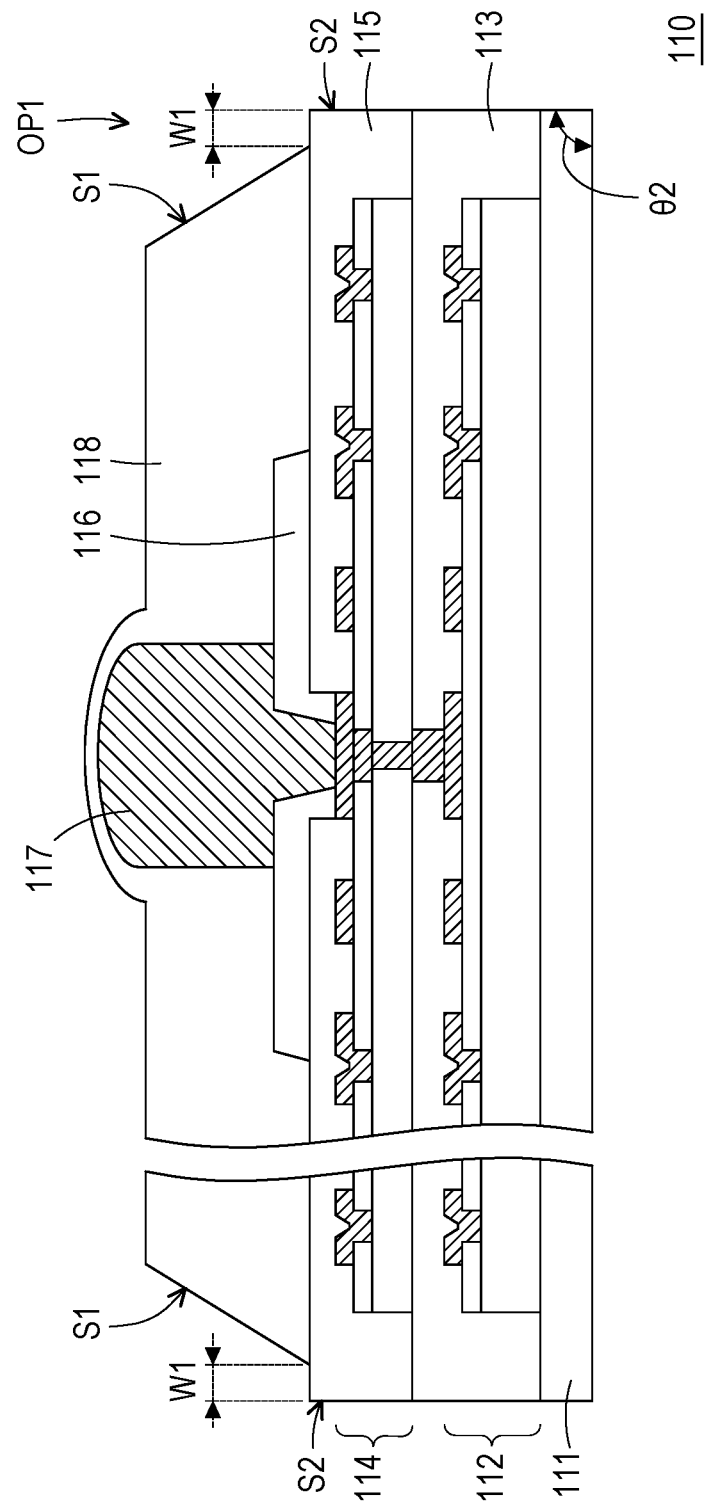

Then, referring to FIG. 7 and FIG. 8, a sawing process is performed to cut through the dielectric layers 113, 115 and the semiconductor substrate 111 to form a plurality of semiconductor devices 110 separated from one another. Instead of laser ablation process, the sawing process is used to cut through the dielectric layers 113, 115, so as to avoid delamination of the oxide (material of dielectric layers 113, 115) to silicon (material of semiconductor substrate 111) interface. The sawing process produces a plurality of grooves OP2 with substantially vertical sidewalls. That is, the outermost side surface S2 of the dielectric layer 113, 115 is substantially a vertical surface. Accordingly, an included angle θ2 included between a side surface and a bottom surface of the semiconductor substrate 111 is substantially equal to or smaller than about 90° and substantially equal to or greater than about 85° (i.e.,) 85≤θ2≤90°. As such, the sidewall S1 of each opening OP1 is tilted with respect to a vertical side surface S2 of each groove OP2 of the dielectric layer 115 cut by the sawing process. The sawing process forms a plurality of grooves OP2 along scribe lines, and the width of the grooves OP2 formed by sawing process is smaller than the smallest width of the opening OP1 formed by photolithography process. Accordingly, the opening OP1 reveals an edge portion of the dielectric layer 115. In other words, the dielectric layer 115 includes an edge portion that is uncovered by the passivation layer 118. In one embodiment, a width W1 of the edge portion is greater than 0 μm and substantially equal to or smaller than 20 μm (i.e., 0 μm<W1≤20 μm). At this point, a manufacturing process of a semiconductor device 110 shown in FIG. 8 is substantially done. If the width W1 equals to zero, which means the bottom of the opening OP1 of the passivation layer 118 is as narrow as the groove OP2 formed by the sawing process, then the blade used for the sawing process applied to the dielectric layer 115 may accidentally contact the passivation layer 118, which may cause cracks, debris, peeling and delamination of the passivation layer 118.

FIG. 9 to FIG. 17 illustrate cross sectional views of intermediate stages in the manufacturing of a semiconductor package according to some exemplary embodiments of the present disclosure. The semiconductor device 110 formed by the process described above may be applied to any suitable semiconductor packages. FIG. 9 to FIG. 17 illustrate one of the possible manufacturing process of a semiconductor package that can be applied, but the disclosure is not limited thereto.

Figure 9:
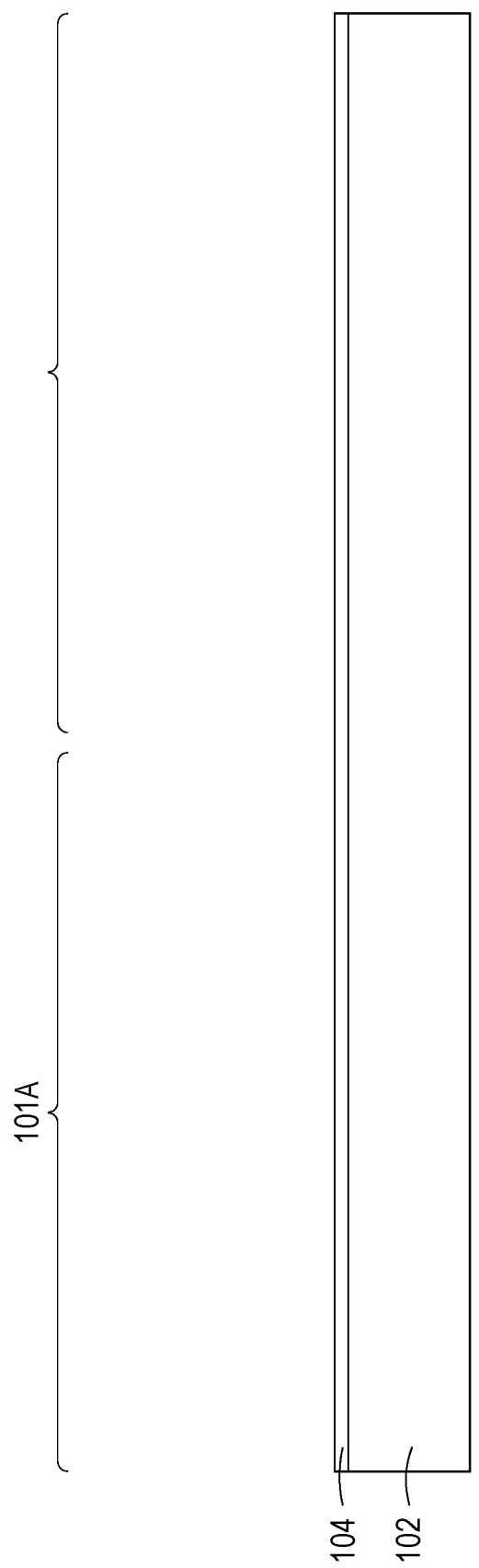
FIG. 9 to FIG. 17 illustrate cross sectional views of intermediate stages in the manufacturing of a semiconductor package according to some exemplary embodiments of the present disclosure.

Referring to FIG. 9, in some embodiments, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. In some embodiments, the release layer 104 may be formed of a polymer-based material, which may be removed along with the carrier substrate 102 from overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV light. The release layer 104 may be dispensed as a liquid and cured, may be a laminate film laminated onto the carrier substrate 102, or may be the like. A top surface of the release layer 104 may be leveled and may have a high degree of planarity. In some embodiments, the release layer 104 may be omitted.

Figure 10:
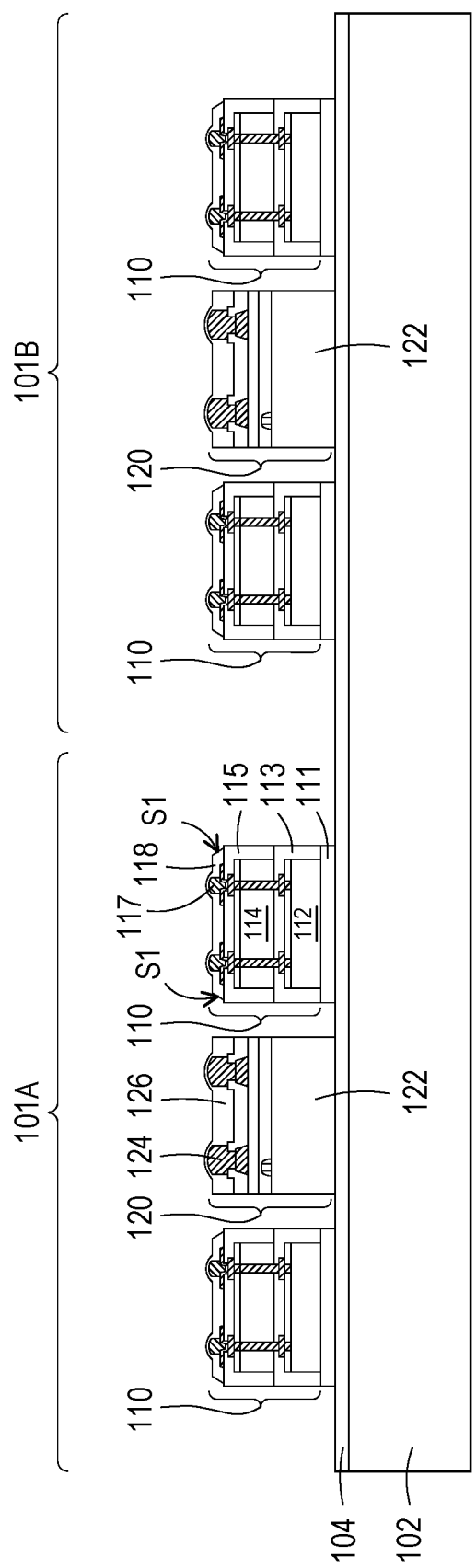

Referring to FIG. 10, a plurality of semiconductor devices 110 and 120 are provided over the carrier substrate 102. In the embodiment illustrated, the semiconductor devices 110 and 120 are adhered to the carrier substrate 102 by the release layer 104. In other embodiment, the semiconductor devices 110 and 120 may be adhered to the carrier substrate 102 by an adhesive applied to the back surfaces of the semiconductor devices 110 and 120. The adhesive may be any suitable adhesive, epoxy, die attach film (DAF), or the like. A desired type and quantity of the semiconductor devices 110 and 120 are adhered in each of the first package region 101A and the second package region 101B. In the embodiment illustrated, multiple of the semiconductor devices 110 and 120 are adhered adjacent one another in a side-by-side manner.

In some embodiments, each of the semiconductor devices 110 is the semiconductor device formed by the manufacturing process described above, which is a stacked device that includes multiple semiconductor dies 112 and 114. Accordingly, semiconductor device 110 includes at least semiconductor dies 112 and 114 stacked on one another, the dielectric layers 113 and 115 cover the top surface and the side surface of the each of the semiconductor dies 112 and 114, and the passivation layer 118 disposed over the dieleclayer 115. The outermost side surface S1 of the passivation layer 118 is a sloped surface tilted with respect to a vertical side surface of the dielectric layer 115 due to two steps of the singulation process (patterning process and sawing process). In some embodiments, the semiconductor device 110 may be a memory die. The memory die may include memory devices such as static random access memory (SRAM) devices, dynamic random access memory (DRAM) devices, other suitable devices, or a combination thereof. The die stack of the semiconductor device 110 may function as a high bandwidth memory (HBM). In some embodiments, the die stack is also a high bandwidth memory that includes multiple stacked memory dies.

In some embodiments, the semiconductor device 120 includes a semiconductor substrate 122 and an interconnection structure formed on the semiconductor substrate 122. In some embodiments, various device elements are formed in the semiconductor substrate 122. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements. The device elements are interconnected through the interconnection structure to form integrated circuit devices. The integrated circuit devices include logic devices, memory devices (e.g., static random access memories, SRAMs), radio frequency (RF) devices, input/output (I/O) devices, system-on-chip (SoC) devices, other applicable types of devices, or a combination thereof. In some embodiments, the semiconductor device 120 is a system-on-chip (SoC) chip that includes multiple functions.

Figure 18:
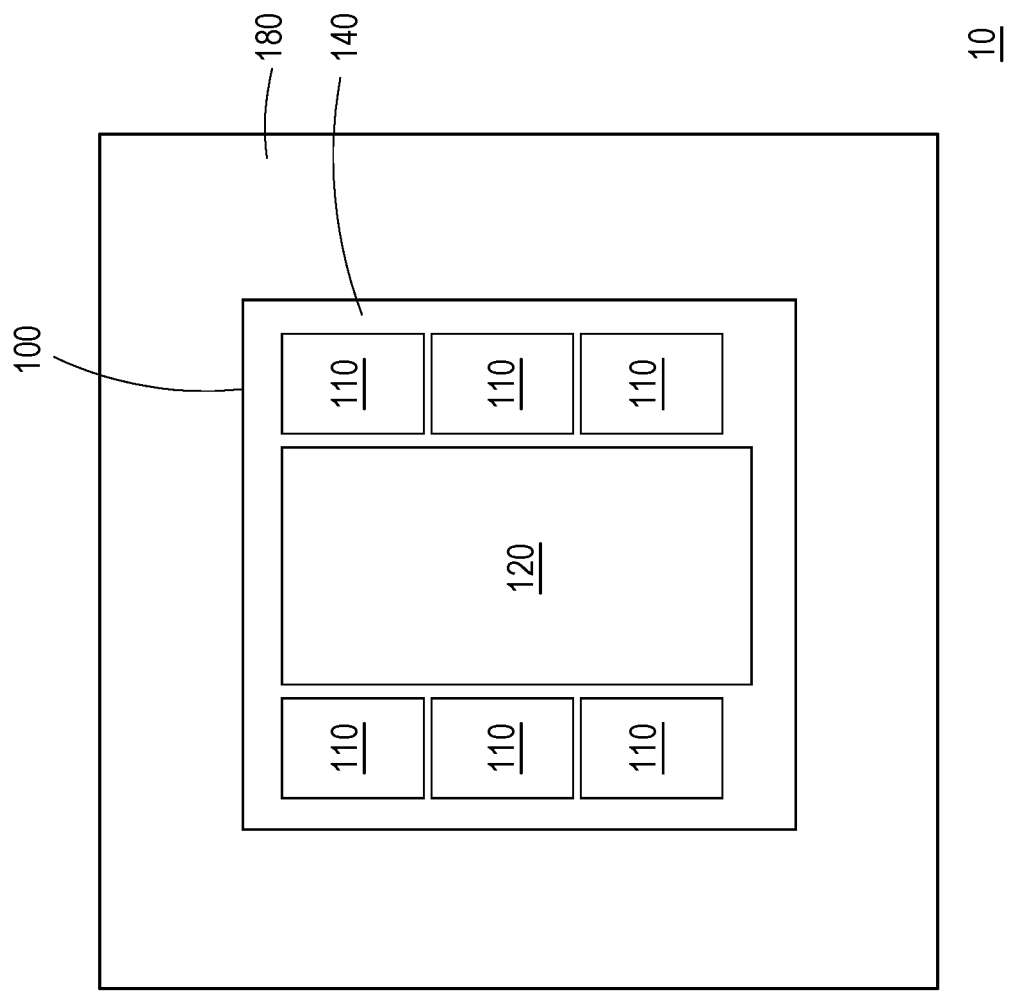
FIG. 18 illustrates a top view of a semiconductor package according to some exemplary embodiments of the present disclosure.

FIG. 18 illustrates a top view of a semiconductor package according to some exemplary embodiments of the present disclosure. Referring to FIG. 10 and FIG. 18, in some embodiments, each of the package regions 101A and 101B may include a semiconductor device 120 and a plurality of semiconductor devices 110 arranged around the semiconductor device 120. In the embodiment of FIG. 18, the semiconductor devices 110 are disposed on two opposite sides of the semiconductor device 120, but the arrangement of the semiconductor devices 110 and 120 is not limited thereto.

Figure 11:
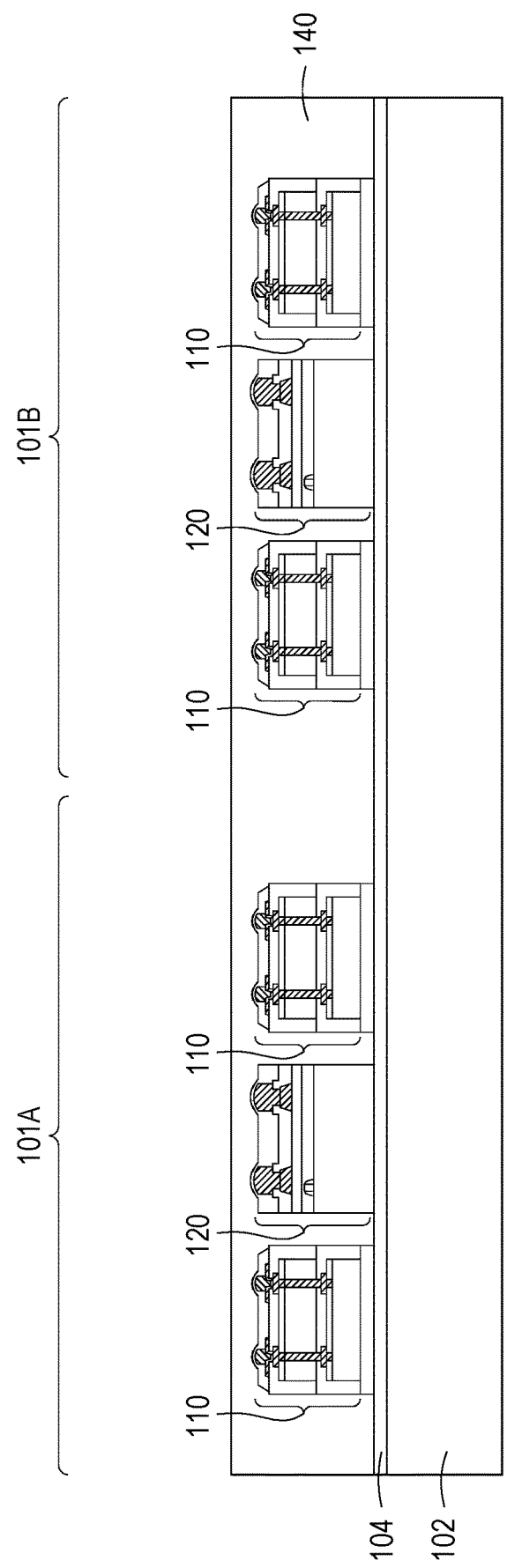
Figure 12:
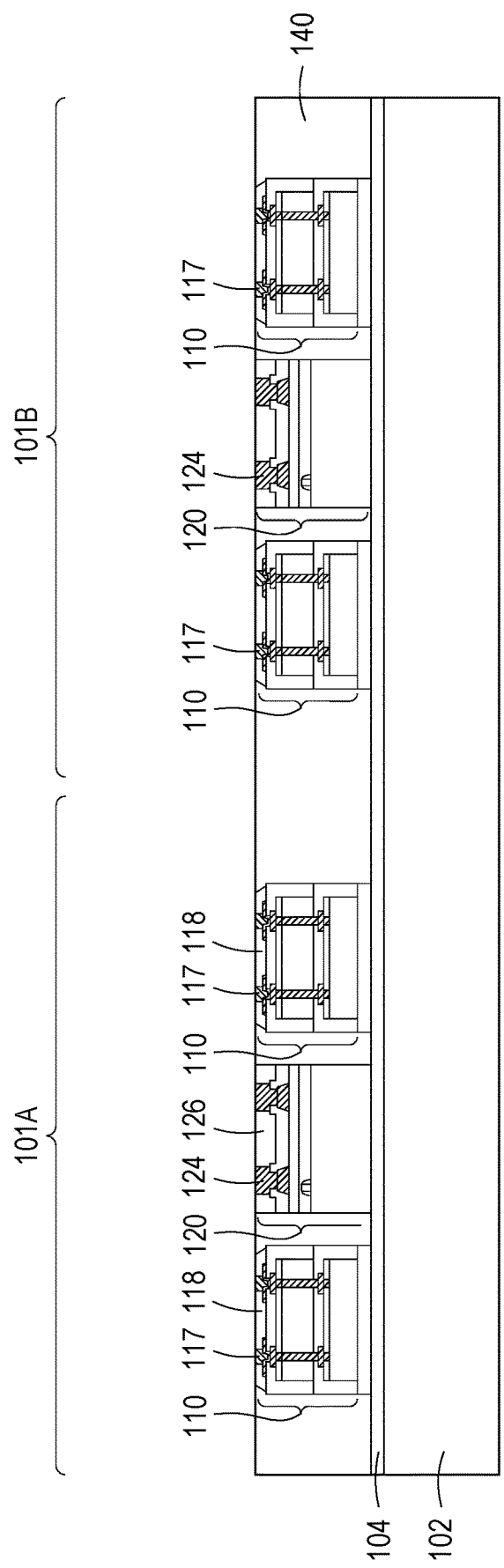

Then, referring to FIG. 11, in some embodiments, an encapsulating material 140 is formed on and around the semiconductor devices 110 and 120. After formation, the encapsulating material 140 encapsulates the semiconductor devices 110 and the semiconductor devices 120. The encapsulating material 140 may be a molding compound, epoxy, or the like. The encapsulating material 140 may be applied by compression molding, transfer molding, or the like, and may be formed over the carrier substrate 102 such that the semiconductor devices 110 and 120 are buried or covered. The encapsulating material 140 is further formed in gap regions between the semiconductor devices 110 and 120. In some embodiments, the encapsulating material 140 may be applied in liquid or semi-liquid form and subsequently cured.

Then, a planarization process is performed on the encapsulating material 140 to expose the connectors 117 of the semiconductor devices 110 and the connectors 124 of the semiconductor devices 120. The planarization process may also remove top portions of encapsulating material 140, the passivation layer 118 of the semiconductor devices 110, and the passivation layer 126 of the of the semiconductor devices 120 until the connectors 117 and 124 are exposed. Following the planarization process, top surfaces of the connectors 117 and 124, the passivation layer 117 and 126, and the encapsulating material 140 may be level with one another (e.g., coplanar). The planarization process may be, for example, a chemical-mechanical polish (CMP) process, a grinding process, an etch-back process, or the like. In some embodiments, the planarization process may be omitted, for example, if the connectors 117 and 124 are already exposed. Accordingly, the encapsulating material 140 laterally encapsulates the semiconductor devices 110 and 120.

In accordance with some embodiments of the disclosure, referring to FIG. 13, the encapsulating material 140 is in contact with the sloped side surface S1 of the passivation layer 118, and the vertical side surface S2 of the dielectric layers 113, 115, and the top surface of the semiconductor substrate 111. In the embodiment illustrated, the acute angle θ1 is included between the outermost side surface S1 of the passivation layer 118 and a bottom surface of the passivation layer 118. As such, the sloped side surface S1 of the passivation layer 118 is tilted with respect to a vertical side surface S2 of the dielectric layer 115, and the encapsulating material 140 laterally encapsulates the sloped side surface S1 of the passivation layer 118 and the vertical side surface S2 of the dielectric layers 113 and 115. In addition, the encapsulating material 140 covers (in contact with) an edge portion of the dielectric layer 115 that is uncovered by the passivation layer 118. In one embodiment, the width W1 of the edge portion is greater than 0 μm and substantially equal to or smaller than 20 μm (i.e., 0 μm<W1≤20 μm). If the width W1 equals to zero, which means the bottom of the opening of the passivation layer 118 is as narrow as the groove formed by the blade saw process, then the blade saw process applied to the dielectric layer 115 may still contact the passivation layer 118, which may cause cracks, debris, peeling and delamination of material layers of the passivation layer 118.

Figure 14:
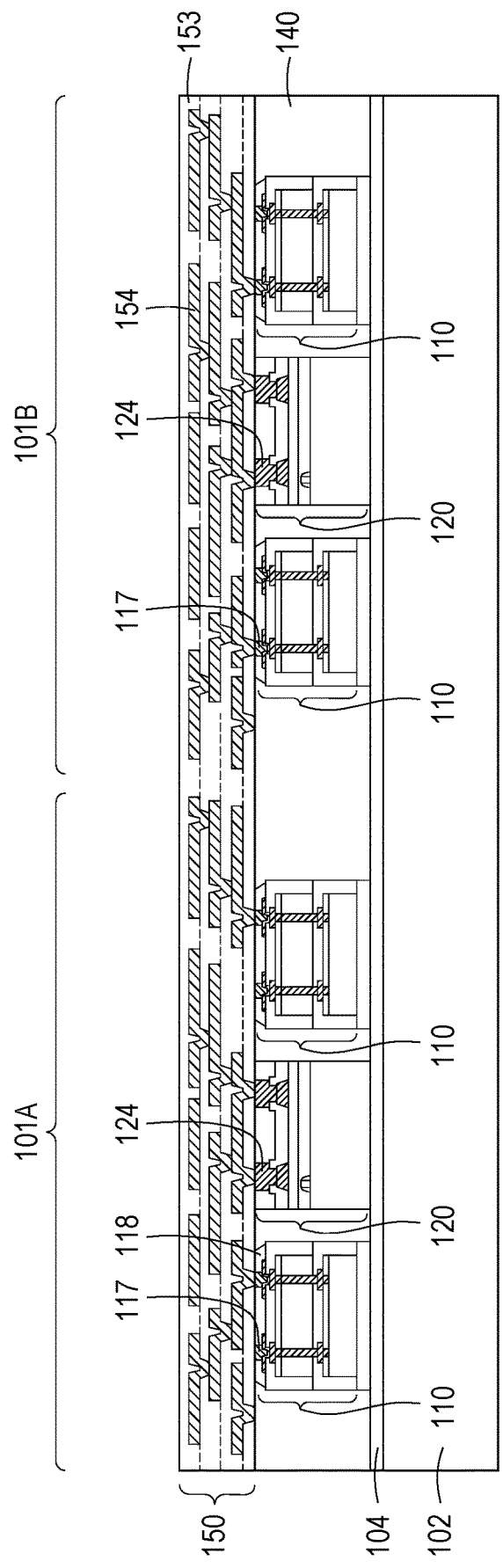

With now reference to FIG. 14, in some embodiments, a redistribution structure 150 is formed over the encapsulating material 140, and the semiconductor devices 110 and 120. The redistribution structure 150 includes dielectric layers 153 and metallization patterns 154. The metallization patterns may also be referred to as redistribution layers or redistribution lines (RDLs). The redistribution structure 150 illustrated in FIG. 14 includes three layers of metallization patterns and four layers of dielectric layers; however, more or fewer metallization patterns and dielectric layers may be included in the redistribution structure 150. Accordingly, the top surfaces of the connectors 117 are coplanar with the top surfaces of the passivation layers 118 and bonded to the redistribution structure 150.

In accordance with some embodiments of the disclosure, the redistribution structure 150 may be used to fan out electrical connections from the semiconductor devices 110 and 120. It should be appreciated that the illustration of the redistribution structure 150 throughout all figures is schematic. The redistribution structure 150 includes redistribution lines (RDLs), such as metal traces (or metal lines), and vias underlying and connected to the metal traces. In accordance with some embodiments of the present disclosure, the RDLs are formed through plating processes, wherein each of the RDLs includes a seed layer (not shown) and a plated metallic material over the seed layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the RDLs. The patterning forms openings through the photo resist to expose the seed layer. A conductive material is formed in the openings of the photo resist and on the exposed portions of the seed layer. The conductive material may be formed by plating, such as electroplating or electroless plating, or the like. The seed layer and the plated metallic material may be formed of the same material or different materials. The conductive material may be a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet and/or dry etching. The remaining portions of the seed layer and conductive material form the RDLs.

Dielectric or passivation layers may be formed over each layer of the metal traces. In some embodiments, the dielectric or passivation layers are formed of a polymer, which may be a photo-sensitive material such as PBO, polyimide, BCB, or the like, that may be patterned using a lithography mask. In other embodiments, the dielectric or passivation layers are formed of a nitride such as silicon nitride; an oxide such as silicon oxide, PSG, BSG, BPSG; or the like. The dielectric or passivation layers may be formed by spin coating, lamination, CVD, the like, or a combination thereof. Openings may be formed in the top dielectric or passivation layer with a patterning process, exposing some or all of the top metal layer of the redistribution structure 150. The patterning process may be an acceptable process, such as by exposing the dielectric or passivation layer to light when the dielectric layer is a photo-sensitive material or by etching using, for example, an anisotropic etch.

Figure 15:
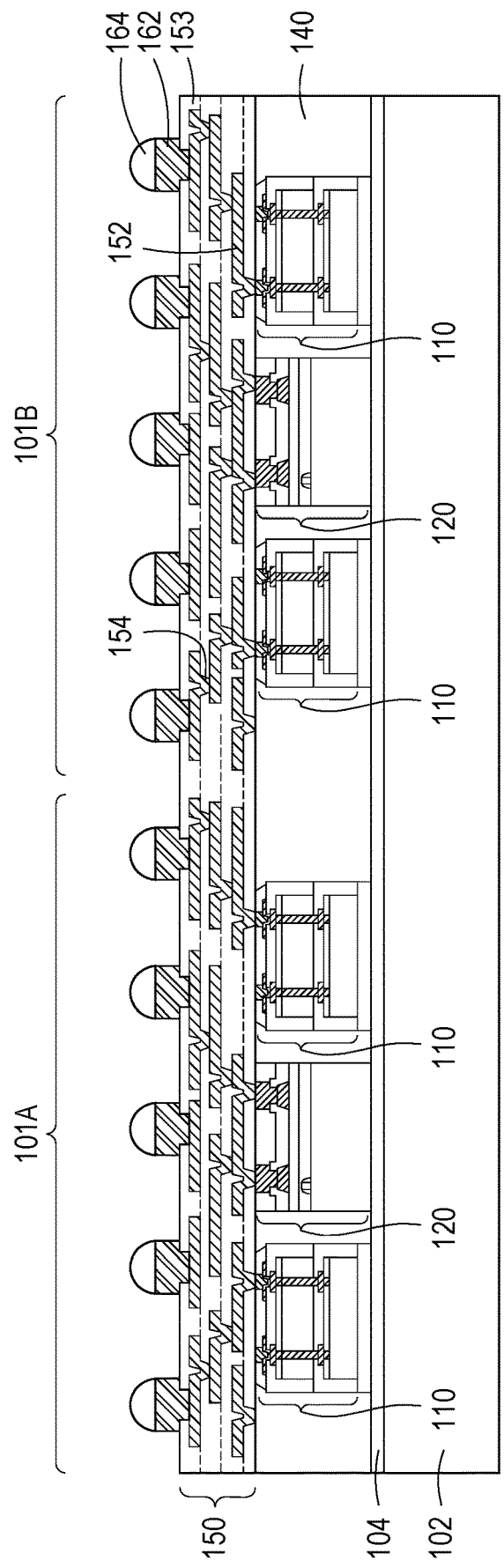

Referring to FIG. 15, then, an UBM layer 162 may be formed for external connection to the redistribution structure 150. The UBM layer 162 has bump portions on and extending along a major surface of the topmost dielectric layer 153, and have via portions extending through the topmost dielectric layer 153 to physically and electrically couple to the metallization pattern 154. As a result, the UBM layer 162 are electrically coupled to the semiconductor devices 110 and 120. The UBM layer 162 may be formed of the same material as the metallization pattern 154.

Then, a plurality of conductive bumps 164 are formed on the UBM layer 162. The conductive bumps 164 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive bumps 164 may include a conductive material such as solder, copper, aluminum, gold, nickel, silver, palladium, tin, the like, or a combination thereof. In some embodiments, the conductive bumps 164 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive bumps 164 include metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 16:
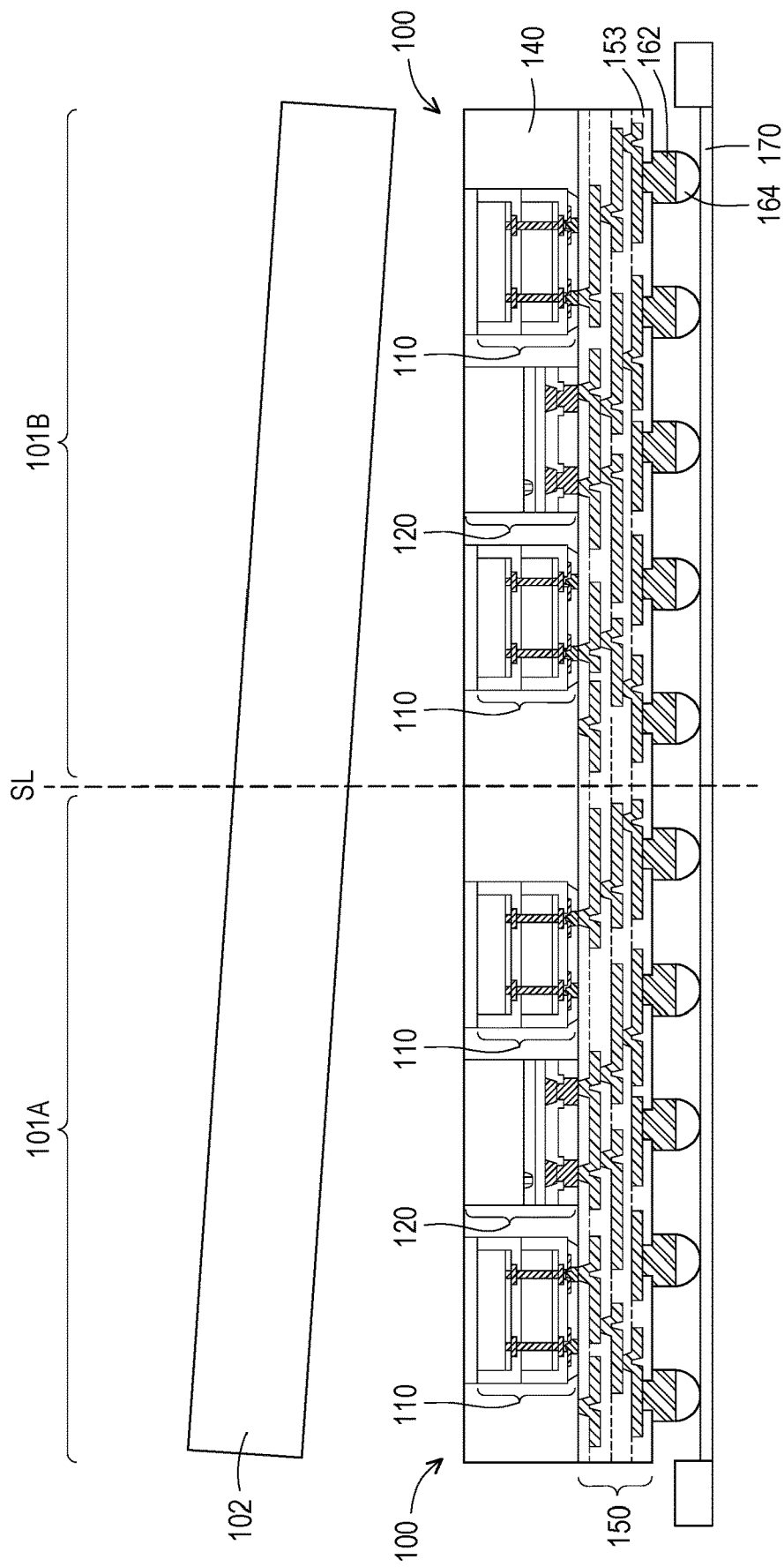

With now reference to FIG. 16, the structure shown in FIG. 15 is flipped, placed on tape 170, and the carrier substrate 102 is de-bonded from the backside of the structure in FIG. 15, e.g., the back surfaces of the encapsulating material 140 and the semiconductor devices 110 and 120. In accordance with some embodiments, the de-bonding includes projecting a light such as a laser light or a UV light on the release layer 104 so that the release layer 104 decomposes under the heat of the light and the carrier substrate 102 can be removed. The structure is then flipped over and placed on the tape 170.

Further in FIG. 16, in some embodiments, a singulation process is performed by sawing along scribe lines SL (e.g., between the first package region 101A and the second package region 101B) to form a plurality of semiconductor packages 100. The resulting semiconductor package 100 includes the redistribution structure 150, the semiconductor devices 110 and 120 disposed over the redistribution structure 150, and the encapsulating material 140 disposed over the redistribution structure 150.

In some embodiments, the redistribution structure 150 may be pre-cut. A cutting apparatus may partially cut into the redistribution structure 150 along scribe lines SL between the first package region 101A and the second package region 101B to form recesses (not separately illustrated) in the redistribution structure 150. In some embodiments, the cutting apparatus for the pre-cut process is a laser. The pre-cut process may prevent delamination of the redistribution structure 150 and its layers during the subsequent sawing process.

In sum, referring to FIG. 7, the method for singularizing the semiconductor devices 110 adopts two steps of the singulation process, which includes the patterning process (e.g., photolithography process) firstly performed on the passivation layer 118 to form the openings OP1, and a sawing process performed to cut through the dielectric layers 113, 115 and the semiconductor substrate 111 to separate the semiconductor devices 110. On the other hand, referring to FIG. 16, the method for singularizing the semiconductor packages 100 may include the sawing process performed to at least cut through the encapsulating material 140 to separate the semiconductor packages 100. Optionally, a precut process (e.g., laser ablation process) may be firstly performed on the redistribution structure 150 to pre-cut the redistribution structure 150, and then the sawing process is performed to cut through the encapsulating material 140.

Figure 17:
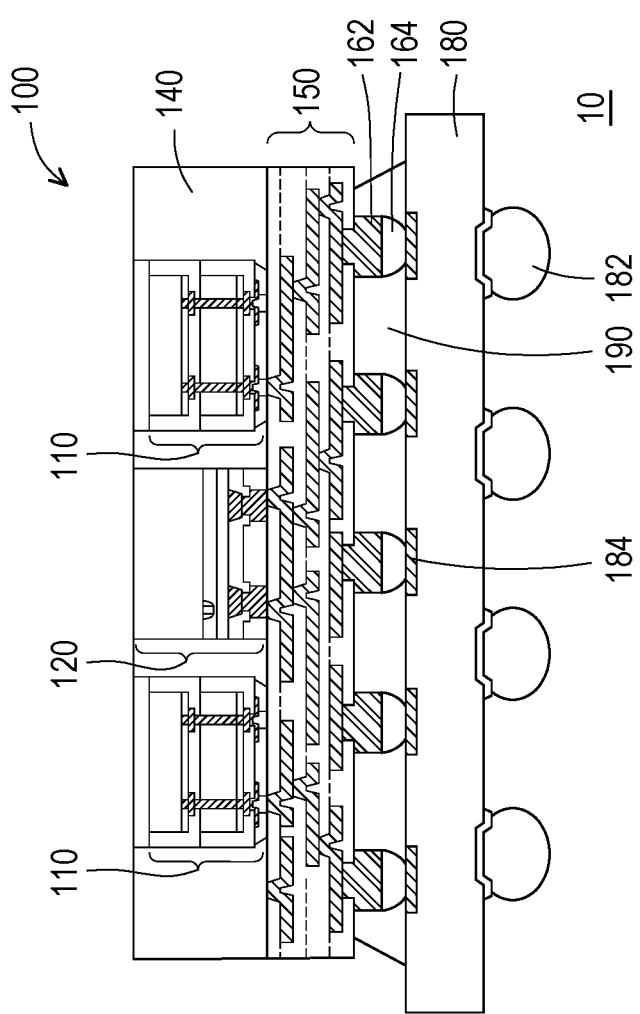

Then, referring to FIG. 17, in some embodiments, one of the singulated semiconductor packages 100 is attached to a package substrate 180 to form a resulting package structure 10. The package substrate 180 may be, e.g., a printed circuit board (PCB) or the like, and may be connected to the semiconductor package 100 through the conductive bumps 164. The package substrate 180 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 180 may be a SOI substrate. Generally, an SOI substrate includes a layer of a semiconductor material such as epitaxial silicon, germanium, silicon germanium, SOI, SGOI, or combinations thereof. The package substrate 180 is, in one alternative embodiment, based on an insulating core such as a fiberglass reinforced resin core. One example core material is fiberglass resin such as FR4. Alternatives for the core material include bismaleimide-triazine (BT) resin, or alternatively, other PCB materials or films. Build up films such as ABF or other laminates may be used for the package substrate 180.

In accordance with some embodiments of the disclosure, the package substrate 180 may include active and passive devices (not shown). As one of ordinary skill in the art will recognize, a wide variety of devices such as transistors, capacitors, resistors, combinations of these, and the like may be used to generate the structural and functional requirements of the design for the resulting package structure. The devices may be formed using any suitable methods. The package substrate 180 may also include metallization layers and vias (not shown), and bond pads 184 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 180 is substantially free of active and passive devices.

In some embodiments, the conductive bumps 164 are reflowed to be bonded to the bond pads 184 of the package substrate 180. The conductive bumps 164 are electrically and/or physically connected to the package substrate 180, including metallization layers in the package substrate 180, to the semiconductor package 100. In some embodiments, an underfill layer 190 may be formed between the gap of the semiconductor package 100 and the package substrate 180 to at least laterally encapsulate the conductive bumps 164. Alternatively, the underfill layer 190 is omitted.

In some embodiments, a plurality of external connectors 182 are formed to make electrical contact with the package substrate 180. In an embodiment, the external connectors 182 may be a ball grid array and may be placed on a bottom surface of the package substrate 180 and may include a eutectic material such as solder, although any suitable materials may alternatively be used. In an embodiment in which the external connectors 182 are solder balls, the external connectors 182 may be formed using a ball drop method to place the external connectors 182 onto underbump metallizations (UBMs), such as a direct ball drop process. Alternatively, the solder balls may be formed by initially forming a layer of tin through any suitable method such as evaporation, electroplating, printing, solder transfer, and then performing a reflow is preferably performed in order to shape the material into the desired bump shape. Once the external connectors 182 have been formed, a test may be performed to ensure that the structure is suitable for further processing.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor device includes a semiconductor substrate, a plurality of semiconductor dies, a dielectric layer, a connector, and a passivation layer. The plurality of semiconductor dies are stacked on one another and disposed over the semiconductor substrate. The dielectric layer covers a top surface and a side surface of the each of the plurality of semiconductor dies. The connector is disposed over a topmost one of the plurality of semiconductor dies. The passivation layer is disposed over the dielectric layer and laterally surrounds the connector, wherein an acute angle is included between an outermost side surface of the passivation layer and a topmost surface of the dielectric layer. In one embodiment, the acute angle is smaller than 90° and substantially equal to or greater than 70°. In one embodiment, the dielectric layer includes an edge portion uncovered by the passivation layer, and a width of the edge portion is greater than 0 µm and substantially equal to or smaller than 20 µm. In one embodiment, an included angle included between a side surface and a bottom surface of the semiconductor substrate is substantially equal to or smaller than 90° and substantially equal to or greater than 85°. In one embodiment, a material of the dielectric layer comprises oxide. In one embodiment, a material of the passivation layer comprises polymer. In one embodiment, an outermost side surface of the dielectric layer is substantially a vertical surface.

In accordance with some embodiments of the disclosure, a semiconductor package includes a redistribution structure, a semiconductor device, and an encapsulating material. The semiconductor device is disposed over the redistribution structure and includes a plurality of semiconductor dies stacked on one another, a dielectric layer cover a top surface and a side surface of the each of the plurality of semiconductor dies, and a passivation layer disposed over the dielectric layer, wherein an outermost side surface of the passivation layer is a sloped surface tilted with respect to a vertical side surface of the dielectric layer. The encapsulating material is disposed over the redistribution structure and laterally encapsulating the semiconductor device. In one embodiment, the semiconductor device further includes a connector disposed over a topmost one of the plurality of semiconductor dies, and the passivation layer laterally surrounds the connector. In one embodiment, a top surface of the connector is coplanar with a top surface of the passivation layer and bonded to the redistribution structure. In one embodiment, an acute angle is included between an outermost side surface of the passivation layer and a topmost surface of the dielectric layer. In one embodiment, the acute angle is smaller than 90° and substantially equal to or greater than 70. In one embodiment, the dielectric layer includes an edge portion uncovered by the passivation layer, and a width of the edge portion is greater than 0 µm and substantially equal to or smaller than 20 µm. In one embodiment, the semiconductor package further include a package substrate bonded to the redistribution structure through a plurality of conductive bumps.

In accordance with some embodiments of the disclosure, a manufacturing method of a semiconductor device includes the following steps. A plurality of first semiconductor dies are provided over a semiconductor substrate, wherein the plurality of first semiconductor dies are separated from one another by a plurality of gaps. A plurality of second semiconductor dies are disposed over the plurality of first semiconductor dies respectively. A dielectric layer is provided over the semiconductor substrate, wherein the dielectric layer covers top surfaces of the plurality of first semiconductor dies and the plurality of second semiconductor dies, and fills the plurality of gaps. A passivation layer is provided over the dielectric layer. A patterning process is performed on the passivation layer to form a plurality of openings corresponding to the plurality of gaps respectively, wherein a sidewall of each of the plurality of openings is a sloped surface tilted from a vertical direction. A sawing process is performed for cutting through the dielectric layer and the semiconductor substrate to form a plurality of semiconductor devices separated from one another. In one embodiment, the plurality of openings penetrating through the passivation layer. In one embodiment, the dielectric layer includes an edge portion uncovered by the passivation layer, and a width of the edge portion is greater than 0 μm and substantially equal to or smaller than 20 μm. In one embodiment, the sidewall of each of the plurality of openings is tilted with respect to a vertical side surface of the dielectric layer cut by the sawing process. In one embodiment, providing the dielectric layer over the semiconductor substrate further includes: providing a first dielectric layer over the semiconductor substrate, wherein the first dielectric layer fills the plurality of gaps and covers top surfaces of the plurality of first semiconductor dies; and providing a second dielectric layer over the plurality of first semiconductor dies, wherein the second dielectric layer covers the first dielectric layer and top surfaces of the plurality of second semiconductor dies. In one embodiment, the manufacturing method of the semiconductor device further includes: providing a connector over each of the plurality of second semiconductor dies, wherein the passivation layer at least laterally surrounds the connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
a plurality of semiconductor dies stacked on one another and disposed over the semiconductor substrate;
a dielectric layer covering a top surface and a side surface of the each of the plurality of semiconductor dies;
a connector disposed over a topmost one of the plurality of semiconductor dies; and
a passivation layer disposed over the dielectric layer and laterally surrounding the connector, wherein, from a cross sectional view, an acute angle is included between an outermost side surface of the passivation layer and a bottom surface of the of the passivation layer.

2. The semiconductor device as claimed in claim 1, wherein the acute angle is smaller than 90° and substantially equal to or greater than 70°.

3. The semiconductor device as claimed in claim 1, wherein the dielectric layer comprises an edge portion uncovered by the passivation layer, and a width of the edge portion is greater than 0 μm and substantially equal to or smaller than 20 μm.

4. The semiconductor device as claimed in claim 1, wherein an included angle included between a side surface and a bottom surface of the semiconductor substrate is substantially equal to or smaller than 90° and substantially equal to or greater than 85°.

5. The semiconductor device as claimed in claim 1, wherein a material of the dielectric layer comprises oxide.

6. The semiconductor device as claimed in claim 1, wherein a material of the passivation layer comprises polymer.

7. The semiconductor device as claimed in claim 1, wherein an outermost side surface of the dielectric layer is substantially a vertical surface.

8. A semiconductor package, comprising:
a redistribution structure;
a semiconductor device over the redistribution structure and comprising a plurality of semiconductor dies stacked on one another, a dielectric layer cover a top surface and a side surface of the each of the plurality of semiconductor dies, and a passivation layer disposed over the dielectric layer, wherein an outermost side surface of the passivation layer is a sloped surface tilted with respect to a vertical side surface of the dielectric layer; and
an encapsulating material over the redistribution structure and laterally encapsulating the semiconductor device.

9. The semiconductor package as claimed in claim 8, wherein the semiconductor device further comprises a connector disposed over a topmost one of the plurality of semiconductor dies, and the passivation layer laterally surrounds the connector.

10. The semiconductor package as claimed in claim 9, wherein a top surface of the connector is coplanar with a top surface of the passivation layer and bonded to the redistribution structure.

11. The semiconductor package as claimed in claim 8, wherein an acute angle is included between an outermost side surface of the passivation layer and a bottom surface of the passivation layer from a cross sectional view.

12. The semiconductor package as claimed in claim 11, wherein the acute angle is smaller than 90° and substantially equal to or greater than 70.

13. The semiconductor package as claimed in claim 8, wherein the dielectric layer comprises an edge portion uncovered by the passivation layer, and a width of the edge portion is greater than 0 μm and substantially equal to or smaller than 20 μm.

14. The semiconductor package as claimed in claim 8, further comprising a package substrate bonded to the redistribution structure through a plurality of conductive bumps.

15. A manufacturing method of a semiconductor device, comprising:
providing a plurality of first semiconductor dies over a semiconductor substrate, wherein the plurality of first semiconductor dies are separated from one another by a plurality of gaps;
providing a plurality of second semiconductor dies over the plurality of first semiconductor dies respectively;
providing a dielectric layer over the semiconductor substrate, wherein the dielectric layer covers top surfaces of the plurality of first semiconductor dies and the plurality of second semiconductor dies, and fills the plurality of gaps;
providing a passivation layer over the dielectric layer;
performing a patterning process on the passivation layer to form a plurality of openings corresponding to the plurality of gaps respectively, wherein a sidewall of each of the plurality of openings is a sloped surface tilted from a vertical direction;
performing a sawing process for cutting through the dielectric layer and the semiconductor substrate to form a plurality of semiconductor devices separated from one another.

16. The manufacturing method of the semiconductor device as claimed in claim 15, wherein the plurality of openings penetrating through the passivation layer.

17. The manufacturing method of the semiconductor device as claimed in claim 15, wherein the dielectric layer comprises an edge portion uncovered by the passivation layer, and a width of the edge portion is greater than 0 μm and substantially equal to or smaller than 20 μm.

18. The manufacturing method of the semiconductor device as claimed in claim 15, wherein the sidewall of each of the plurality of openings is tilted with respect to a vertical side surface of the dielectric layer cut by the sawing process.

19. The manufacturing method of the semiconductor device as claimed in claim 15, wherein providing the dielectric layer over the semiconductor substrate further comprises:
- providing a first dielectric layer over the semiconductor substrate, wherein the first dielectric layer fills the plurality of gaps and covers top surfaces of the plurality of first semiconductor dies; and
- providing a second dielectric layer over the plurality of first semiconductor dies, wherein the second dielectric layer covers the first dielectric layer and top surfaces of the plurality of second semiconductor dies.

20. The manufacturing method of the semiconductor device as claimed in claim 15, further comprising:
- providing a connector over each of the plurality of second semiconductor dies, wherein the passivation layer at least laterally surrounds the connector.

\* \* \* \* \*